United States Patent
Bildgen

[19]

[11] Patent Number: 6,144,174
[45] Date of Patent: *Nov. 7, 2000

[54] CONTROL DEVICE FOR LOW-PRESSURE FLUORESCENT LAMP

[75] Inventor: Marco Bildgen, Fuveau, France

[73] Assignee: SGS-Thomson Microelectronics S.A., Gentilly, France

[*] Notice: This patent issued on a continued prosecution application filed under 37 CFR 1.53(d), and is subject to the twenty year patent term provisions of 35 U.S.C. 154(a)(2).

[21] Appl. No.: 08/783,993

[22] Filed: Jan. 15, 1997

[30] Foreign Application Priority Data

Jan. 19, 1996 [FR] France .................................. 96 00823

[51] Int. Cl.⁷ .................................................. H05B 37/02
[52] U.S. Cl. ................................ 315/307; 315/DIG. 7; 315/241 R; 315/244
[58] Field of Search ............................ 315/200 R, 226, 315/DIG. 7, 241 R, 245, 244, 307

[56] References Cited

U.S. PATENT DOCUMENTS

| | | | |
|---|---|---|---|
| 4,429,359 | 1/1984 | Anderson | 363/132 |
| 4,581,562 | 4/1986 | Nilssen | 315/DIG. 7 |
| 4,935,672 | 6/1990 | Lammers et al. | 315/DIG. 7 |
| 5,164,637 | 11/1992 | Nilssen | 315/209 R |
| 5,455,758 | 10/1995 | Pelly | 363/47 |

FOREIGN PATENT DOCUMENTS

| | | | |
|---|---|---|---|
| 0 171 108 | 2/1986 | European Pat. Off. | H05B 41/29 |
| 0 390 285 | 10/1990 | European Pat. Off. | H05B 41/39 |
| 0 399 613 | 11/1990 | European Pat. Off. | H05B 41/29 |

OTHER PUBLICATIONS

French Search Report from French Patent Application 96/00823, filed Jan. 19, 1996.

*Primary Examiner*—Michael B Shingleton
*Attorney, Agent, or Firm*—Wolf, Greenfield & Sacks, P.C.; James H. Morris; Theodore E. Galanthay

[57] ABSTRACT

To control low-pressure fluorescent lamps, there is provided a device comprising a first change-over switch circuit and a second change-over switch circuit, respectively including a first power transistor and a second power transistor. The first change-over switch circuit first of all measures the period of time when the second power transistor is on. Then, secondly, it turns the first power transistor on for a period equal to the period measured.

42 Claims, 2 Drawing Sheets

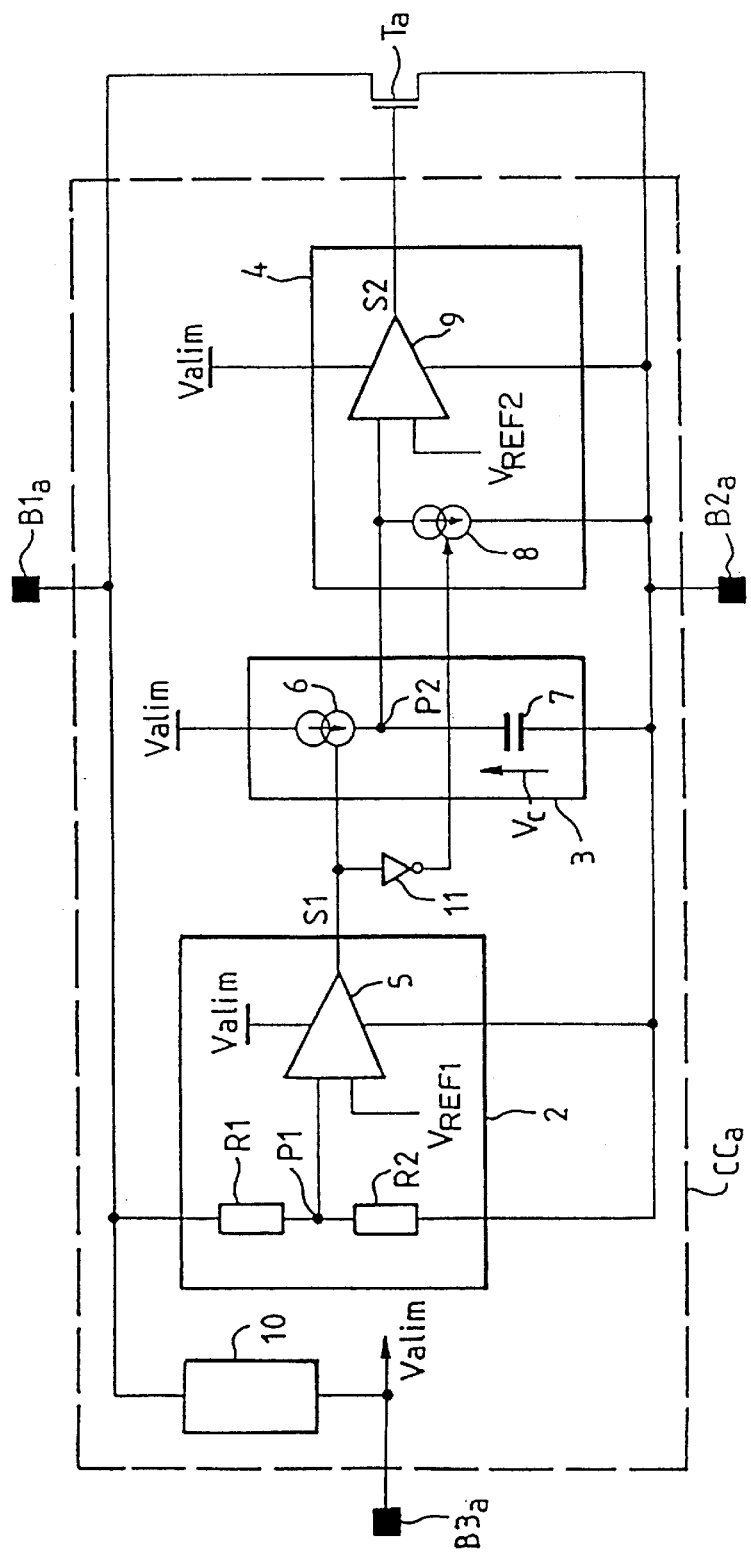
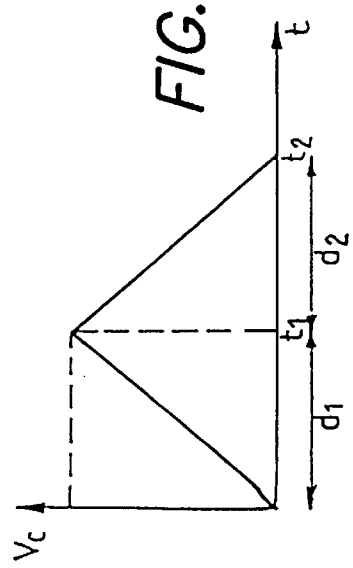
FIG. 2
FIG. 3

CONTROL DEVICE FOR LOW-PRESSURE FLUORESCENT LAMP

BACKGROUND OF THE INVENTION

1. Field of the Invention

The invention relates to a control device for a low-pressure fluorescent lamp.

The electrical behavior of fluorescent lamps containing low-pressure gases is similar to that of a zener diode (or avalanche diode), with a resistance in the gas that becomes very low and negative after breakdown. Ions driven at high speed take the atoms of the gas into excited states in which they send out luminous streaks.

2. Discussion of the Related Art

The means used to control these lamps consist of a control device with current source and an oscillating circuit in which the lamp is placed. This oscillating circuit typically has an inductor and a first capacitor that is series-connected with the lamp as well as a second capacitor that is parallel-connected with the lamp. Through this system, current discharges can be made to pass between the two electrodes of the lamp in both directions.

Conventionally, the current source control device has two electronic change-over switches using power transistors supplied by a DC high voltage and a current transformer. The current transformer is preferably a saturation transformer that limits the current in the lamp by the saturation of its core and causes the switching over of the change-over switches.

The electronic change-over switches generally use power transistors based on bipolar technology for the switch-over function and reverse-biased, parallel-connected diodes to conduct the current during the alternations, and various protection elements.

These transformer-based devices require much space and are costly because they require many components and permit only small-scale integration.

To overcome these drawbacks of costs and small-scale integration, control devices without transformers have been developed. These devices illustrated in FIG. 1 comprise two change-over switch or selector switch circuits $Com_a$ and $Com_b$ series-connected between a high supply voltage and the ground. Each change-over switch circuit has a power transistor $T_a$, $T_b$ with a diode $D_a$, $D_b$ parallel-connected in reverse forming the change-over switch, and a control circuit $CC_a$, $CC_b$ to control the gate of the transistor. The diode is generally a parasitic diode of the transistor.

The control circuits $CC_a$ and $CC_b$ comprise a circuit for the detection of the voltage at the terminals of the diode $D_a$, $D_b$ to activate the ON state of the transistor $T_a$, $T_b$ when this voltage is zero and a circuit to measure the current flowing into the transistor $T_a$, $T_b$ to activate the OFF state of the transistor when the integral of this current is greater than a reference value of current.

The principle of operation of the control device is as follows: it is assumed that, when the system is started up, the change-over switch circuit $Com_a$ is closed, i.e. that the transistor $T_a$ is on and that the change-over switch circuit $Com_b$ is open.

The change-over switch circuit $Com_a$ therefore lets through the current flowing in the lamp F and measures this current. When it detects the fact that sufficient current has gone into the transistor $T_a$, it goes into an open state. The voltage at the terminals of the inductor gets reversed and the current of the lamp which has to continue to flow somewhere then goes into the reverse-mounted diode $D_b$ of the second change-over switch circuit $Com_b$. The passage of the current into the diode $D_b$ causes a drop in the voltage at its terminals. This drop in voltage is then detected by the control circuit $CC_b$ and the transistor $T_b$ comes on. At the same time, the inductor of the oscillating circuit gets demagnetized. When it is totally demagnetized, the capacitor Cs gets discharged into the lamp F and the current going into the lamp flows in the other direction.

The control circuit thus formed consists of two change-over switch circuits that work independently. For, each circuit detects a drop in voltage at its terminals, goes into the closed state and then, in detecting that sufficient current has passed between its terminals, goes into the open state.

At the resonance frequency $f_0$ of the system formed by the oscillating circuit and lamp, it can be seen that the change-over switch circuits are opened successively for a half-cycle. In this type of device, it is therefore not necessary for the two change-over switch circuits to work independently.

SUMMARY OF THE INVENTION

The invention therefore proposes a control device comprising a first intelligent change-over switch circuit as described here above and a second floating change-over switch circuit that works dependently with respect to the first circuit.

The invention is aimed at proposing a control device that costs less and enables better integration.

Thus, an object of the invention is a control device for a low-pressure fluorescent lamp comprising a first change-over switch circuit and a second change-over switch circuit series-connected between a high voltage and the ground, the first change-over switch circuit comprising a first power transistor, the second change-over switch circuit comprising a second power transistor, an inductor being series-connected with the low-pressure fluorescent lamp and with a capacitor between the midpoint of the two change-over switch circuits and the ground, wherein the first change-over switch circuit comprises:
  a circuit for the measurement of the period of time during which the second power transistor is on to measure a first period, and
  a switching-on circuit to turn the first power transistor on during a second period that is consecutive and equal to the first period.

BRIEF DESCRIPTION OF THE DRAWINGS

Other advantages and characteristics of the invention are presented in the following description, given by way of an indication that in no way restricts the invention and with reference to the appended drawings, of which:

FIG. 2 is a detailed diagram of a floating change-over switch circuit according to the invention; and FIG. 3 is a timing diagram of the voltage of the terminals of a capacitor of the floating change-over switch circuit according to the invention.

DETAILED DESCRIPTION

Figure 1:
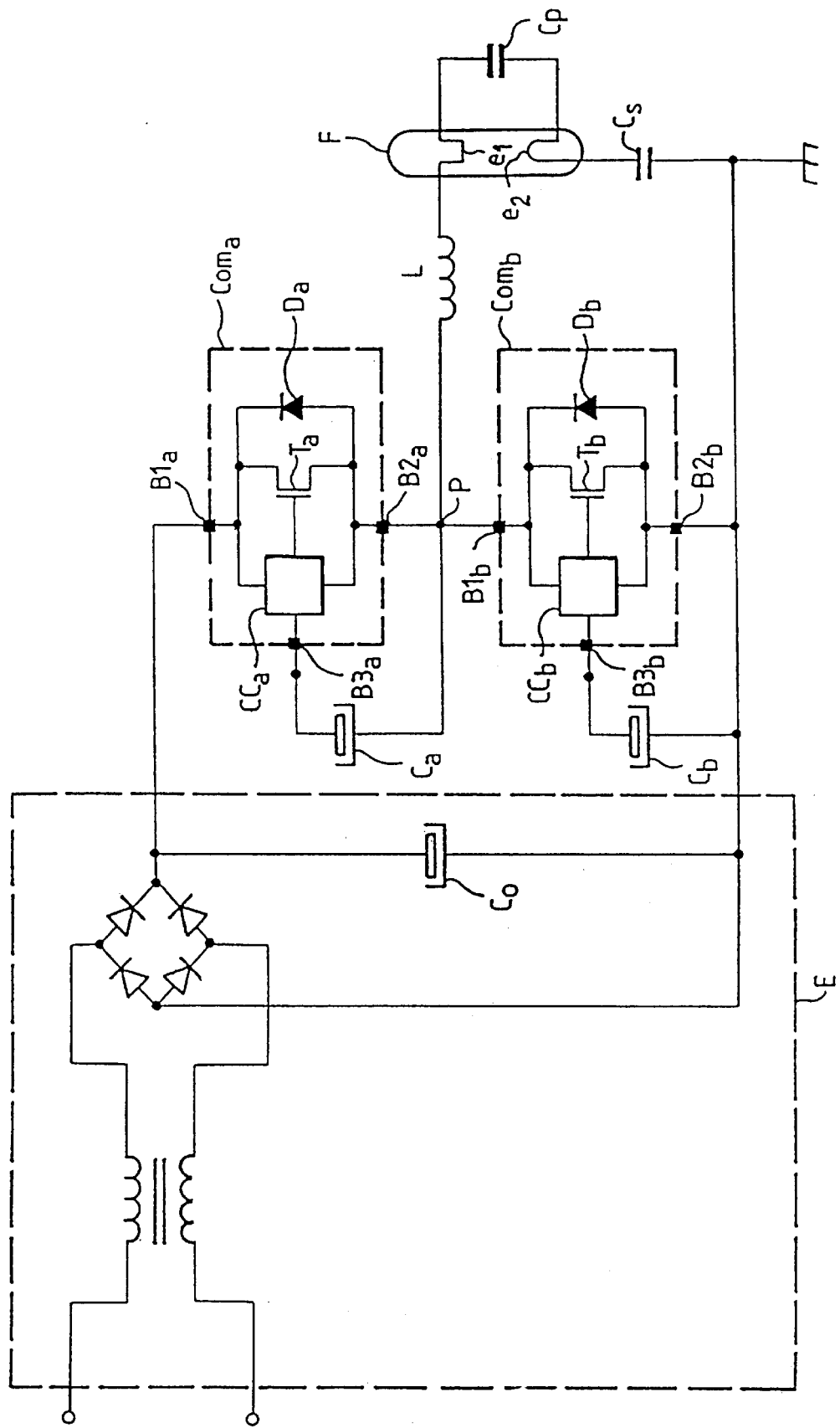
FIG. 1 is a general diagram of a device for the control of a low-pressure fluorescent lamp according to the invention.

FIG. 1 shows a control device for a low-pressure fluorescent lamp.

The control device has two different change-over switch circuits $Com_a$ and $Com_b$ series-connected between a high voltage and the ground. In the example, the high voltage is given by a supply stage E with rectifier and filtering capacitor $C_0$ to maintain a DC supply voltage of the order of 300 volts at the terminal of the control device.

In the example, the circuit $Com_b$ is an intelligent change-over switch circuit working independently as described in the introduction to the present application. The circuit $Com_a$ is described in detail in FIG. 2.

The circuits $Com_a$ and $Com_b$ have three external terminals respectively referenced $B1_a$, $B2_a$, $B3_a$ and $B1_b$, $B2_b$, $B3_b$. The terminals $B1_a$ and $B2_a$ (respectively $B1_b$ and $B2_b$) are the connection terminals of the circuit. The terminal $B3_a$ (and $B3_b$ respectively) is a decoupling terminal for the supply of the circuits internal to the change-over switch circuit.

The terminals $B3_a$ and $B3_b$ are each connected to a decoupling capacitor $C_a$ and $C_b$ respectively connected to the terminals $B2_a$ and $B2_b$ of the circuits. The role of these capacitors is to maintain an internal supply voltage in the circuits $Com_a$ and $Com_b$, irrespective of the voltage between their connection terminals $B1_a$ and $B2_a$, $B1_b$ and $B2_b$.

The change-over switch circuits $Com_a$, $Com_b$ comprise chiefly a power transistor $T_a$, $T_b$ and a gate control circuit $CC_a$ $CC_b$ between the two connection terminals $B1_a$ and $B2_a$, $B1_b$ and $B2_b$. The control circuits $CC_a$ and $CC_b$ respectively control the gates of the transistors $T_a$ and $T_b$. A diode $D_a$, $D_b$ is connected in parallel and in reverse with the transistor $T_a$, $T_b$.

In the preferred example, the transistors $T_a$ and $T_b$ are MOSFET type power transistors. To turn them on, it is necessary to apply a voltage of about 15 volts to their gate and to turn them off it is necessary to apply a voltage of about 0 volts.

The midpoint P between the two change-over switch circuits $Com_a$ and $Com_b$ is connected to a terminal of an inductor L that is connected, at the other terminal, to a first electrode e1 of a low-pressure fluorescent lamp F. The second electrode e2 of the lamp is connected to a capacitor Cs, the other terminal of which is connected to the ground. The inductor L, the lamp F and the capacitor Cs are therefore series-connected and form an oscillating circuit.

Furthermore, a starting-up capacitor Cp is parallel-connected with the lamp F. A surge voltage at the terminals of this capacitor prompts the breakdown of the gas in the lamp when the lamp is turned on.

The following is general principle of the operation of the control device for the lamp according to the invention. The current flowing in the lamp goes sometimes in one direction and sometimes in the other. During a first period, it is assumed that the current is flowing in the power transistor $T_b$. The transistor $T_a$ is off. The voltage between the two connection terminals of the circuit $Com_b$ is then zero and all the high voltage is located between the connection terminals of the change-over switch circuit $Com_a$. The change-over switch circuit $Com_b$ measures the current flowing through the transistor $T_b$ to turn it off when the integral of this current goes beyond a reference current value.

At the same time, the circuit $Com_a$ measures the period during which the transistor $T_b$ is on. When a sufficient amount of current has passed through the transistor $T_b$, the circuit $Com_b$ commands the turning off of the transistor $T_b$ and goes into an open state. The circuit $Com_a$ then detects the change in state of the circuit $Com_b$ and goes into a closed state.

The current flowing in the lamp then goes through the circuit $Com_a$. The reverse-connected diode $D_a$ conducts the current at the time of the alternation. Following the change in state of the power transistor $T_b$, the power transistor $T_a$ comes on. The change-over switch circuit $Com_a$ is maintained in the closed state for a period equivalent to the period measured earlier. When the transistor $T_a$ goes off again, the current of the lamp goes into the diode $D_b$. The circuit $Com_b$ then detects a very low voltage at the terminals of the diode and the transistor $T_b$ comes on again.

The device formed by an intelligent circuit $Com_b$ and a dependent circuit $Com_a$ is particularly valuable in that the two control circuits cannot be simultaneously in the same state, in which case the system formed by the oscillating circuit and the lamp would not start up.

FIG. 2 is a detailed diagram of one embodiment of a change-over switch circuit $Com_a$ comprising the transistor $T_a$ and its associated control circuit $CC_a$. The diode $D_a$ is a parasitic diode of the transistor $T_a$. It has first of all three external terminals: two connection terminals $B1_a$ and $B2_a$ and one decoupling terminal $B3_a$.

The power transistor $T_a$ is connected between the terminals $B1_a$ and $B2_a$ of the circuit. The control circuit $CC_a$ has a detection circuit 2 to detect the conduction of the power transistor $T_b$, a circuit 3 to measure the duration of the conduction of the power transistor $T_b$ and a switching-on circuit 4 to place the power transistor $T_a$ in a state of conduction for a period equal to the period measured by the measurement circuit 3 when the power transistor $T_b$ is off.

First of all, the change-over switch circuit $Com_a$ detects the state of the power transistor $T_b$. The detection circuit 2 has a resistive divider constituted in the example by two resistive elements R1 and R2 placed between the connection terminals $B1_a$ and $B2_a$. This divider is designed especially to reduce the voltage excursion between the two connection terminals, for it may attain 400 volts, in order to bring it to a voltage level that is more acceptable to the comparator of voltage to be followed.

The midpoint P1 between the two resistive elements is connected to a first negative input of a voltage comparator 5 which, at a second positive input, receives a reference voltage $V_{ref1}$. In the example, it is desired that the comparator should modify its output level at each change in state of the power transistor $T_b$. In this example, the value of the reference voltage $V_{ref1}$ is chosen so as to be greater than the voltage at the point P1 when the power transistor $T_b$ is on and smaller than this voltage if the power transistor $T_b$ is off. The voltage comparator is conventionally a differential pair.

At output, the voltage comparator 5 delivers a detection signal s1 indicating the state of the change-over switch circuit $Com_b$. This detection signal is at a high level when the transistor $T_b$ is on and at a low level if it is not on.

During the high level of the detection signal s1, the change-over switch circuit $Com_a$ measures the period of time during which the power transistor $T_b$ is on. The duration measuring circuit 3 has a current source 6 series-connected with a capacitor 7. The current source 6 and the capacitor 7 are placed between a supply voltage $V_{alim}$ and the connection terminal $B2_a$. The current source 6 is controlled by the detection signal s1 coming from the comparator 5. The current source is therefore activated when the transistor $T_b$ is on. During this half-period, the capacitor 7 is charged until the change-over switch circuit $Com_b$ goes into an open state. The charge of the capacitor 7 when the transistor $T_b$ is off is a measure of the period of conduction of this transistor.

The switching-on circuit 4 has a current source 8 connected between the midpoint P2 of the current source 6 and the capacitor 7 and the connection terminal $B2_a$. The current source 8 enables the capacitor 7 to get discharged when the transistor $T_b$ is off. Furthermore, it is controlled by the reverse detection signal/s1 coming from the inverter gate 11. The discharge time for the capacitor represents a second period during which the transistor $T_a$ is on. According to an advantageous embodiment, the current sources 6 and 8 are identical so that the periods of time taken to charge and discharge the capacitor 7 are equal. These current sources may be made out of current mirror type structures.

Furthermore, the midpoint P2 is connected to the positive input of a voltage comparator 9 which receives the reference voltage $V_{ref2}$ at its negative input. This comparator delivers a conduction signal s2.

In the example, the value of the reference voltage $V_{ref2}$ is chosen in such a way that the signal s2 is at a high level when the transistor $T_b$ is off and in such a way that when the transistor $T_b$ is on the capacitor 7 is not entirely discharged. The conduction signal s2 coming from the voltage comparator 9 enables the activation of the power transistor gate $T_a$.

Finally, a charging circuit 10 is designed to charge the decoupling capacitor $C_a$ so that the supply voltage $V_{alim}$ present at the decoupling terminal $B3_a$ is in the range of 15 volts. The supply voltage $V_{alim}$ is used to supply the different circuits (voltage comparators, current sources) of the change-over switch circuit $Com_a$.

This charging circuit 10 may be formed by a current source series-connected with a diode and connected between the connection terminal $B1_a$ and the decoupling capacitor $C_a$. The decoupling capacitor $C_a$ is charged with the current coming from the current source when the voltage between the connection terminals $B1_a$ and $B2_a$ is high. The decoupling capacitor maintains the supply voltage $V_{alim}$ when the power transistor $T_a$ is on.

Through this assembly, the voltage difference between the decoupling terminal $B3_a$ and the connection terminal $B2_a$ is preserved irrespective of the state of the power transistor $T_a$. Consequently, the voltage comparators 5 and 9, the current sources 6 and 8 and the inverter gate 12 are supplied between the terminals $B3_a$ and $B2_a$.

The overall functioning of the change-over switch circuit $Com_a$ is as follows: when the transistor $T_b$ is on, the voltage of the point P1 is lower than the reference voltage $V_{ref1}$. The signal s1 is then at a high level. The current source controlled by this signal s1 charges the capacitor 7. During the charging of the capacitor 7, since the voltage of the point P2 is smaller than the reference voltage $V_{ref2}$, the signal s2 is at a low level and the transistor $T_a$ is off.

As soon as the transistor $T_b$ goes off, the increase in the voltage at the point P1 modifies the state of the detection signal s1. The signal s1 goes to a low level and the current source 6 is cut off. Conversely, the current source 8 is activated and enables the discharging of the capacitor 7. So long as the capacitor is not entirely discharged, the voltage at the point P2 is greater than the reference voltage $V_{ref2}$. The conduction signal s2 is at a high level and the transistor $T_a$ is then on. Once the capacitor 7 is entirely discharged, the signal s2 changes its level and the transistor $T_a$ is off.

FIG. 3 shows the changes undergone by the voltage $V_c$ at the terminals of the capacitor 7 as a function of time. The charging time d1 and the discharging time d2 of the capacitor are equal so that each transistor $T_a$ and $T_b$ is on for a half-cycle. This equality is obtained by using two identical voltage sources 6 and 8.

Preferably, the control circuit $Com_a$ takes the form of an integrated circuit with three pins corresponding to the three external terminals.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A control device for a low-pressure fluorescent lamp comprising a first change-over switch circuit and a second change-over switch circuit series-connected between a high voltage and the ground, a first change-over switch circuit comprising a first power transistor, the second change-over switch circuit comprising a second power transistor, an inductor being series-connected with the low-pressure fluorescent lamp and with a capacitor between the midpoint of the two change-over switch circuits and the ground, wherein the first change-over switch circuit comprises:
a circuit for measuring the period during which the second power transistor is on to measure a first period; and
a switching-on circuit to turn the first power transistor on during a second period that is consecutive and equal to the first period.

2. A device according to claim 1, wherein the first change-over switch circuit further comprises a circuit for detecting the conduction of the second power transistor comprising a resistive divider connected between the high voltage and the midpoint of the two change-over switch circuits and a first voltage comparator connected to a first input at a point of the resistive divider and receiving, at a second input, a first voltage reference value to deliver a signal for the detection of the conduction of the second power transistor.

3. A device according to claim 1, wherein the measurement circuit comprises a first current source series-connected with a capacitor between a supply voltage and the midpoint of the first and second change-over switch circuits, the first current source being activated by the detection signal to charge the capacitor while the second power transistor is on.

4. A device according to claim 3, wherein the switching-on circuit comprises a second current source connected between the midpoint of the first current source and the capacitor and the midpoint of the two change-over switch circuits, the second current source being controlled by the inverted detection signal, a second voltage comparator connected to a first input at the midpoint of the first current source and of the capacitor and receiving a second voltage reference value at a second input, the output of the second voltage comparator being connected to the gate of the first power transistor to deliver a signal for turning the first power transistor on.

5. A device according to claim 4, wherein the second current source is identical to the first current source.

6. A device according to claim 1, wherein a decoupling capacitor is connected between the supply terminal and the midpoint of the first and second change-over switch circuits to maintain a constant level of supply voltage at a supply terminal.

7. A device according to claim 6, wherein the first change-over switch circuit comprises a charge circuit to charge the decoupling capacitor when the first power transistor is off.

8. A control device for a fluorescent lamp comprising:
a first change-over switch circuit;
a second change-over switch circuit;
a high-voltage supply;
said first and second change-over switches being connected in series across said high-voltage supply;
said first change-over switch circuit comprising a first power transistor;
said second change-over switch circuit comprising a second power transistor;
a fluorescent drive circuit intercoupling the fluorescent lamp and the connection points of the first and second change-over switch circuits;
said first change-over switch circuit comprising:
a circuit for measuring a period during which the second power transistor is on for a first period, and
a switch-on circuit to turn on the first power transistor during a second period that is consecutive and substantially equal to the first period.

9. A device for a fluorescent lamp according to claim 8 wherein the circuit for measuring comprises a circuit for detecting the conduction of the second power transistor.

10. A device for a fluorescent lamp according to claim 9 wherein said circuit for detecting the conduction comprises a resistive divider coupled between one side of the high voltage supply and the connection point of the two change-over switch circuits.

11. A device for a fluorescent lamp according to claim 10 wherein said circuit for detecting the conduction further comprises a first voltage comparator having one input coupled from the resistive divider and another input for receiving a first voltage reference value to deliver a signal for the detection of the conduction of the second power transistor.

12. A device for a fluorescent lamp according to claim 9 wherein said circuit for measuring further comprises a measurement circuit including a charging capacitor adapted to be charged while the second power transistor is on.

13. A device for a fluorescent lamp according to claim 12 wherein the measurement circuit further comprises a first current source series-connected with said changing capacitor, said first current source being activated by the detection signal to charge the capacitor while the second power transistor is on.

14. A device for a fluorescent lamp according to claim 13 wherein the first current source and the charging capacitor are coupled between a supply voltage and the connection point of the first and second change-over switch circuits.

15. A device for a fluorescent lamp according to claim 13 wherein the switch-on circuit comprises a second current source coupled between the first current source and the connection point of the two change-over switch circuits.

16. A device for a fluorescent lamp according to claim 15 wherein the switch-on circuit further comprises a second voltage comparator.

17. A device for a fluorescent lamp according to claim 16 wherein the second current source is connected between the midpoint of the first current source and the capacitor and the connection point of the two change-over switch circuits.

18. A device for a fluorescent lamp according to claim 17 wherein the second current source is controlled by an inversion of the detection signal.

19. A device for a fluorescent lamp according to claim 18 wherein the second voltage comparator is connected at a first input to the midpoint of the first current source and of the capacitor and receiving a second voltage reference value at a second input, the output of the second comparator being connected to the gate of the first power transistor to deliver a signal for turning the first power transistor on.

20. A device for a fluorescent lamp according to claim 15 wherein the first and second current sources are substantially identical.

21. A device for a fluorescent lamp according to claim 8 including a decoupling capacitor connected between a supply input of the first change-over switch circuit and the connection point of the two change-over switch circuits, to maintain a constant level of supply voltage at said supply input.

22. A device for a fluorescent lamp according to claim 21 wherein said first change-over switch circuit comprises a charge circuit to charge the decoupling capacitor when the first power transistor is off.

23. A control device for a fluorescent lamp comprising:
a first change-over switch means;
a second change-over switch means;
means interconnecting said first and second change-over switch means in series at a connection point and across said high-voltage supply;
each said change-over switch means comprising a power transistor;
means for intercoupling the connection point of the switch means to said fluorescent lamp;
said first change-over switch means each comprising:
a circuit means for measuring a period during which the second power transistor is on for a first period, and
a switch-on circuit means to turn on the first power transistor during a second period that is consecutive and substantially equal to the first period.

24. A device for a fluorescent lamp according to claim 23 wherein the circuit means for measuring comprises a circuit means for detecting the conduction of the second power transistor.

25. A device for a fluorescent lamp according to claim 24 wherein said circuit means for detecting comprises a divider means coupled between one side of the high voltage supply and the connection point of the two change-over switch means.

26. A device for a fluorescent lamp according to claim 25 wherein said circuit means for detecting further comprises a first comparator means having one input coupled from the divider means and another input for receiving a first voltage reference value.

27. A device for a fluorescent lamp according to claim 24 wherein said circuit means for measuring further comprises a measuring means including a charging capacitor.

28. A device for a fluorescent lamp according to claim 24 wherein said circuit means for measuring further comprises a first current source series-connected with said charging capacitor.

29. A device for a fluorescent lamp according to claim 28 wherein said first current source and the charging capacitor are coupled between a supply voltage and the connection point of the change-over switch means.

30. A device for a fluorescent lamp according to claim 28 wherein the switch-on circuit means comprises a second current source coupled between the first current source and the connection point of the two change-over switch means.

31. A device for a fluorescent lamp according to claim 30 wherein the switch-on circuit means further comprises a second comparator means.

32. A device for a fluorescent lamp according to claim 31 wherein the second current source is connected between the midpoint of the first current source and the capacitor, and the connection point of the two change-over switch means.

33. A device for a fluorescent lamp according to claim 32 wherein the second current source is controlled by an inversion of the detection signal.

34. A device for a fluorescent lamp according to claim 33 wherein the second comparator means is connected at a first input to the midpoint of the first current source and of the capacitor and receiving a second voltage reference value at a second input, the output of the second comparator means coupling to drive the first power transistor.

35. A device for a fluorescent lamp according to claim 30 wherein the first and second current sources are substantially identical.

36. A device for a fluorescent lamp according to claim 23 including a decoupling capacitor connected between a supply input of the first change-over switch means and the connection point of the two change-over switch means, to maintain a constant level of supply voltage at said supply input.

37. A device for a fluorescent lamp according to claim 36 wherein each said change-over switch means comprises a charge circuit means to charge the decoupling capacitor.

38. A method of controlling the operation of a fluorescent lamp comprisingthe steps of:

providing first and second change-over switch circuits each having respective first and second power transistors;

coupling said change-over switch circuits to said fluorescent lamp;

said first change-over switch circuit performing steps of:
measuring a period during which the second power transistor is on to define a first period, and
turning the first power transistor on during a second period that is consecutive and substantially equal to the first period.

39. A device according to claim 1, wherein the period is a time period measured independent of any voltage measuring point.

40. A device for a fluorescent lamp according to claim 8, wherein the period is a time period measured independent of any voltage measuring point.

41. A device for a fluorescent lamp according to claim 23, wherein the period is a time period measured independent of any voltage measuring point.

42. A method according to claim 38, wherein the period is a time period measured independent of any voltage measuring point.

* * * * *